(12) United States Patent
Li et al.

(10) Patent No.: US 8,575,994 B2
(45) Date of Patent: Nov. 5, 2013

(54) CIRCUIT AND METHOD FOR GENERATING A CLOCK SIGNAL

(75) Inventors: Alex Li, Shanghai (CN); Welsin Wang, Shanghai (CN)

(73) Assignee: STMicroelectronics (China) Investment Co., Shanghai (CN)

( * ) Notice: Subject to any disclaimer, the term of this patent is extended or adjusted under 35 U.S.C. 154(b) by 71 days.

(21) Appl. No.: 13/313,250

(22) Filed: Dec. 7, 2011

(65) Prior Publication Data

US 2012/0169399 A1 Jul. 5, 2012

(30) Foreign Application Priority Data

Dec. 31, 2010 (CN) .......................... 2010 1 0624785

(51) Int. Cl.
*H01L 37/00* (2006.01)

(52) U.S. Cl.
USPC .......................................... 327/512; 327/291

(58) Field of Classification Search
USPC ................... 327/165, 291, 292, 512, 513
See application file for complete search history.

(56) References Cited

U.S. PATENT DOCUMENTS

| 5,604,468 | A | * | 2/1997 | Gillig | 331/176 |
| 6,160,458 | A | * | 12/2000 | Cole et al. | 331/158 |
| 6,249,173 | B1 | * | 6/2001 | Nakaizumi | 327/513 |
| 8,138,846 | B2 | * | 3/2012 | Seth et al. | 331/177 R |
| 8,237,482 | B2 | * | 8/2012 | Ge | 327/291 |

* cited by examiner

*Primary Examiner* — Jeffrey Zweizig
(74) *Attorney, Agent, or Firm* — Gardere Wynne Sewell LLP

(57) ABSTRACT

A clock source is configured to provide an oscillating signal to be divided into a clock signal. A temperature sensor senses a first temperature of the clock source. The clock source is subjected to at least one second temperature implemented by a temperature alteration module. A calibration module calibrates the clock signal based on the at least one second temperature, the first temperature, a reference signal, and the oscillating signal at the at least one second temperature.

18 Claims, 3 Drawing Sheets

CIRCUIT AND METHOD FOR GENERATING A CLOCK SIGNAL

PRIORITY CLAIM

This application claims priority from Chinese Application for Patent No. 201010624785.1 filed Dec. 31, 2010, the disclosure of which is hereby incorporated by reference.

TECHNICAL FIELD

This invention relates generally to electronic circuits, and more particularly to a circuit and method for generating a clock signal.

BACKGROUND

A real-time clock (RTC) device is present in many electronic devices, for example personal computers, servers and embedded systems, which need to keep accurate time. The RTC device operates by dividing an oscillating signal, provided by a clock source, typically a 32.768 kHz crystal, into a clock signal of 1 Hz.

Most applications require clock accuracy of better than 5 parts per million (ppm). The factors affecting the clock accuracy include ambient temperature, ambient humidity and shock, among which the ambient temperature factor contributes most. The RTC device needs calibration due to a nature of the frequency deviation over temperature, especially when used over a wide temperature range.

Many approaches have been applied to compensate for the frequency deviation due to temperature variation. One approach is tuning the crystal to a nominal frequency by adjusting the capacitive load added to the crystal. Another approach is periodically modifying the clock frequency by subtracting or inserting clock pulses. Both approaches are based on a frequency versus temperature curve of the crystal, according to which a compensation recipe at a time or during a period is calculated using the temperature of the crystal as input.

Generally, crystals in one batch are regarded to have similar frequency performance, and it is a normal practice to measure frequency versus temperature curves of several crystals within one batch and take the average of curves as the curve of each crystal within the batch, which is loaded into a memory for calibration purpose. However, each crystal behaves differently due to manufacturing errors, for example. In addition, thermal shock during soldering can also alter a crystal's frequency.

Therefore, a custom or specific frequency-temperature curve for each crystal is essential when considering high accuracy levels or for some other purpose. To accomplish this, the supplier needs to analyze each crystal's frequency performance under several different ambient temperatures by moving all testing benches among testing rooms with different temperatures or waiting for the testing room to reach a desired ambient temperature. The manpower and time needed for such effort could be cumbersome.

It would therefore be desirable to achieve a circuit and method for generating a custom frequency-temperature curve for each crystal effectively. It would also be advantageous to achieve a circuit and method for generating a clock signal based on a custom frequency-temperature curve for each crystal.

SUMMARY

In one embodiment, a circuit comprises a clock source configured to provide an oscillating signal to be divided into a clock signal; a temperature sensor configured to sense a first temperature at the clock source; wherein the clock source is configured to be subjected to at least one second temperature implemented by a temperature alteration module configured to alter a temperature at the clock source; and a calibration module configured to calibrate the clock signal based on the first temperature, the at least one second temperature, a reference signal, and the oscillating signal at the at least one second temperature.

In another embodiment, an electronic device comprises a circuit that comprises a clock source configured to provide an oscillating signal to be divided into a clock signal; a temperature sensor configured to sense a first temperature at the clock source; wherein the clock source is configured to be subjected to at least one second temperature implemented by a temperature alteration module configured to alter a temperature at the clock source; and a calibration module configured to calibrate the clock signal based on the first temperature, the at least one second temperature, a reference signal, and the oscillating signal at the at least one first temperature.

In a further embodiment, a method comprises subjecting a clock source to at least one first temperature; generating at least one calibration parameter based on the at least one first temperature, a reference signal and an oscillating signal of the clock source at the at least one first temperature; measuring a second temperature of the clock source; and calibrating a clock signal, obtained by dividing the oscillating signal, based on the at least one calibration parameter and the second temperature.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different Figures generally refer to corresponding parts unless otherwise indicated. The Figures are drawn to clearly illustrate the relevant aspects of embodiments of the present disclosure and are not necessarily drawn to scale. To more clearly illustrate certain embodiments, a letter indicating variations of the same structure, material, or process step may follow a Figure number.

DETAILED DESCRIPTION OF THE DRAWINGS

The making and using of embodiments are discussed in detail below. It should be appreciated, however, that the specific embodiments discussed are merely illustrative, and do not limit the scope of the invention.

Figure 1:
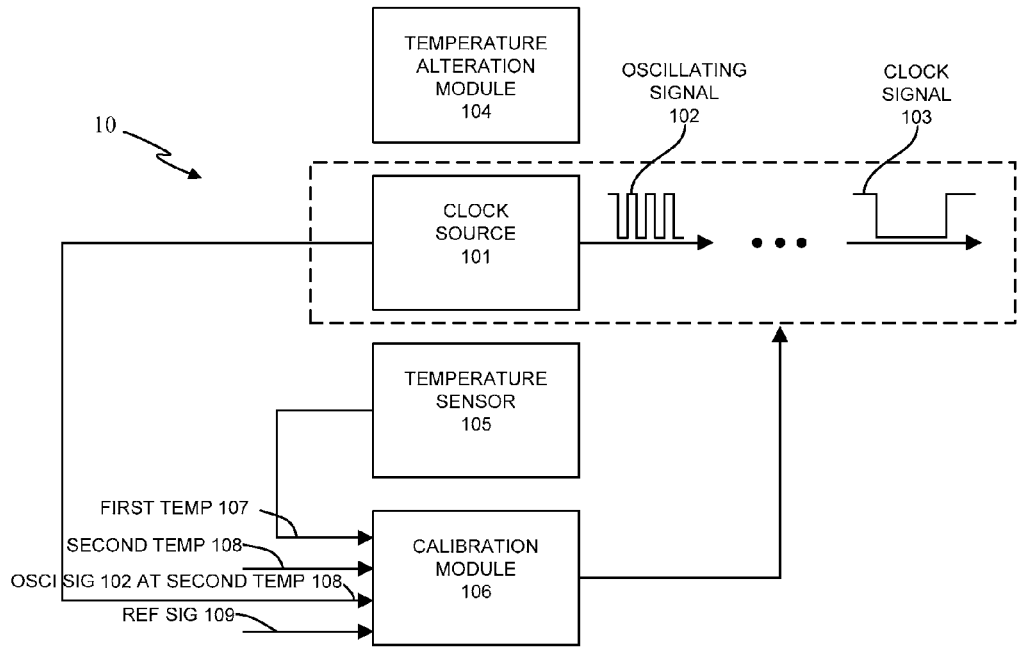
FIG. 1 illustrates a circuit for generating a clock signal according to one embodiment.

FIG. 1 illustrates a circuit 10 for generating a clock signal 103 according to one embodiment. The circuit 10 comprises a clock source 101 configured to provide an oscillating signal 102. A temperature sensor 105 is configured to sense a first temperature 107 of the clock source 101. The clock source 101 is operatively subjected to at least one second temperature 108 implemented by a temperature alteration module 104. The circuit 10 further comprises a calibration module 106 configured to calibrate the clock signal 103. In one example, the circuit 10 may operate as follows.

Firstly, the clock source 101 is subjected to at least one second temperature 108 implemented by the temperature alteration module 104 configured to alter a temperature at the clock source 101. In practice, the second temperature 108 may be a local temperature of the clock source 101, during, for example, a testing phase before shipment. By characterizing an oscillating signal 102 of the clock source 101 at the at least one second temperature 108, a specific temperature dependent frequency performance of the clock source 101 can be learned.

Afterwards, for calibration purpose, the temperature sensor 105 senses the first temperature 107 of the clock source 101. In practice, the first temperature 107 is a temperature of the clock source 101 during operation, which can vary due to severe climates, self-heating of the clock source 101, or other reasons.

Then, the calibration module 106 calibrates the clock signal 103 based on the at least one second temperature 108, the first temperature 107, a reference signal 109 and the oscillating signal 102 of the clock source 101 at the at least one second temperature 108. The reference signal 109 is for the purpose of evaluating the accuracy of the oscillating signal 102 and may be provided by any high precision frequency source.

From the foregoing, since the temperature alteration module 104 alters a temperature at the clock source 101, the second temperature 108 can be altered effectively and independently of the ambient temperature. In this way, the manpower and time for moving all testing benches among testing rooms with different temperatures or waiting for the testing room to reach a desired ambient temperature can be saved.

In addition, the circuit 10 makes a custom frequency-temperature curve for each clock source 101 easy to implement. Thus, the limitation in accuracy of the clock signal due to inaccurate frequency-temperature curve of clock source 101 can be improved.

Furthermore, since the circuit 10 enables a custom frequency-temperature curve of each clock 101, it would be acceptable to use moderate-precision crystals or low-precision crystals as clock sources. Because moderate-precision crystals or low-precision crystals are cheaper than high-precision crystals, the circuit 10 is advantageous in cost-sensitive applications.

Additionally, in comparison with a common solution of adding a dedicated RTC, for example a off-the-shelf temperature-compensated crystal oscillator (TXCO), to a board which increases the board space, it would be space effective to integrate the calibration module 106, the frequency divider (not shown) of the circuit 10, and/or the temperature sensor 105 in, for example, a microcontroller unit (MCU) that performs other functions as well.

It should be appreciated that calibration module 106 may calibrate the clock signal 103 by any suitable algorithm or configuration. For example, the calibration module 106 may calculate a correction voltage to be applied to a varactor diode based on the at least one second temperature 108, the first temperature 107, the reference signal 109 and the oscillating signal 102 at the at least one second temperature 108. Alternatively, the calibration module 106 may calculate the number of clock pulses to be inserted into or subtracted periodically based on the at least one second temperature 108, the first temperature 107, the reference signal 109 and the oscillating signal 102 at the at least one second temperature 108. The embodiment provides a circuit and method for generating a custom frequency-temperature curve for each clock source, and the algorithm or configuration by which the clock signal is calibrated is not a limiting factor.

It should be appreciated that the number of the at least one second temperature 108 may vary depending on, for example, the order of the polynomial used to fit the frequency-temperature curve of the clock source 101. In detail, for example, the clock source is a quartz crystal with a nominal frequency of 32.768 kHz, and the polynomial takes the form of $(f-f_0)/f_0=K*(T-T_0)^2+X$, where f is the oscillating frequency of the clock source 101 at temperature T, $f_0$ is the nominal frequency of 32.768 kHz, K is the curvature constant, $T_0$ is the turnover temperature and X is the frequency accuracy offset at $T_0$. In this case, by solving three simultaneous equations, the values of K, $T_0$ and X can be found, given the frequency of the oscillating signal 102 at three different second temperatures 108. In another example, the curvature constant K is regarded as the same for crystals of one batch, and the clock source 101 is configured to be subjected to two different second temperatures 108 to obtain the values of $T_0$ and X. In still another example, the polynomial takes the form of $(f-f_0)/f_0=K_1*(T-T_0)^2+K_2*(T-T_0)+X$ for a more exact fitting or other purpose, and the clock source 101 is configured to be subjected to four different second temperatures 108 to find the values of $K_1$, $K_2$, $T_0$ and X.

Figure 2:
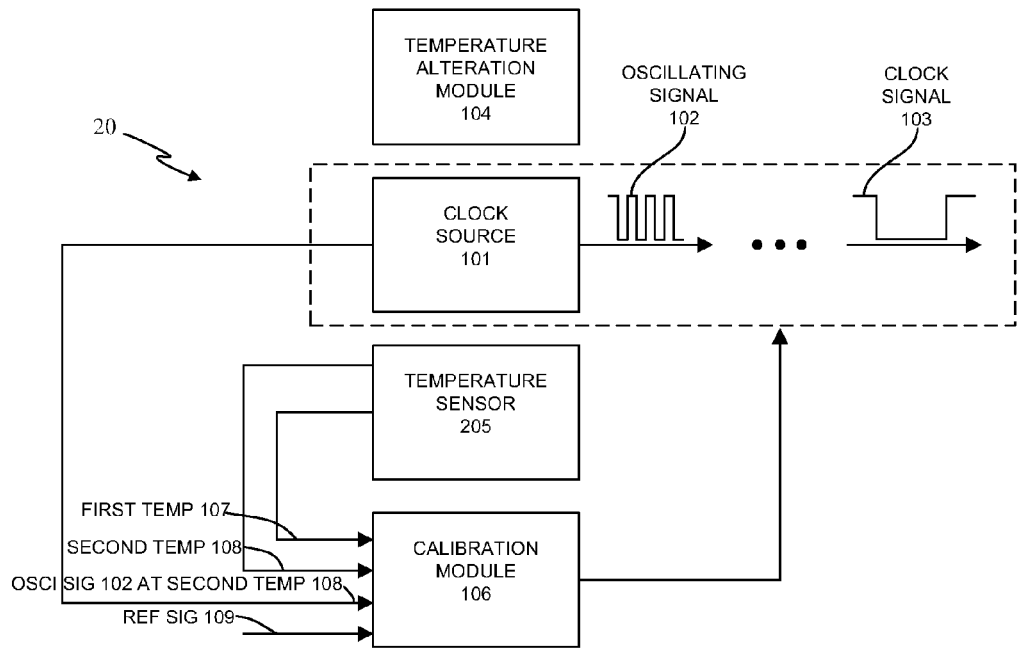
FIG. 2 illustrates a circuit for generating a clock signal according to another embodiment.

FIG. 2 illustrates a circuit 20 for generating a clock signal 103 according to one embodiment. With respect to the circuit 10 shown in FIG. 1, the temperature sensor 205 of the circuit 20 is further configured to sense the second temperature 108. Since the temperature sensor 205 can give the value of the second temperature 108, the need to control the temperature alteration module 104 to obtain an expected second temperature 108 may be eliminated.

In one example, the clock source 10 is incorporated in circuit 10 or 20 as an internal component.

Hereinafter, exemplary forming of the calibration module 106, the temperature alteration module 104 and the temperature sensor 105 and 205 will be described.

Figure 3:
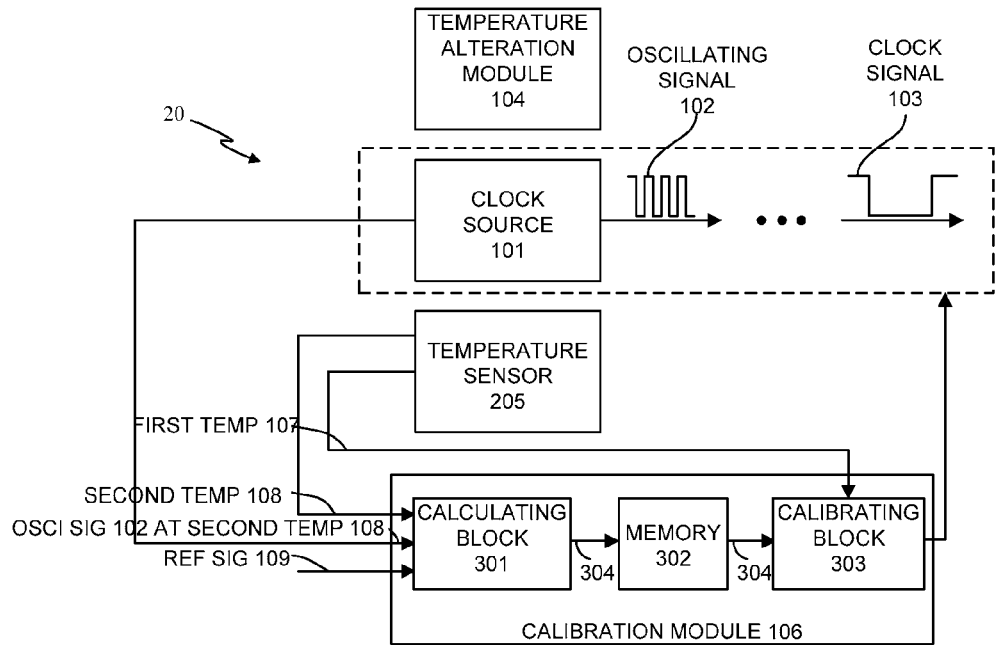
FIG. 3 illustrates an exemplary forming of the calibration module of the circuit of FIG. 2.

FIG. 3 illustrates an exemplary forming of the calibration module 106. As shown, the calibration module 106 comprises a calculating block 301, a memory 302 and a calibrating block 303. The calibration module 106 operates as follows.

Firstly, the calculating block 301 is coupled to receive at least one second temperature 108 from the temperature sensor 205, the oscillating signal 102 at the at least one second temperature 108 from the clock source 101, and the reference signal 109 from a high precision frequency source. The calculating block 301 generates at least one calibration parameter 304 based on the at least one second temperature 108, the oscillating signal 102 at the at least one second temperature

108, and the reference signal 109, by solving at least one simultaneous equation corresponding to the at least one second temperature 108.

Afterwards, the memory 302 is coupled to receive the at least one calibration parameter 304 from the calculating block 301.

Finally, the calibrating block 303 is coupled to receive the first temperature 107 from the temperature sensor 205 and the at least one calibration parameter 304 from the memory 302, and calibrates the clock signal 103 based on the first temperature 107 and the at least one calibration parameter 304.

It should be appreciated that calibrating block 303 may calibrate the clock signal 103 by any suitable algorithm or configuration. For example, the calibrating block 303 may calculate a correction voltage to be applied to a varactor diode to adjust the capacitive load on the clock source 101 based on the first temperature 107 and the at least one calibration parameter 304. Alternatively, the calibrating block 303 may calculate the number of pulses to be inserted into or subtracted periodically based on the first temperature 107 and the at least one calibration parameter 304. The algorithm or configuration by which the clock signal is calibrated is not a limiting factor.

Figure 4:
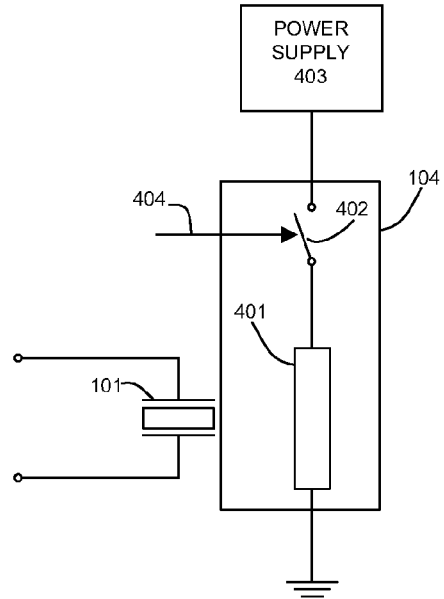
FIG. 4 illustrates an exemplary forming of the temperature alteration module of the circuits of FIG. 1 and FIG. 2.

FIG. 4 illustrates an exemplary forming of the temperature alteration module 104. As shown, the temperature alteration module 104 comprises a power resistor 401 and a switch 402. In operation, the power resistor 401 is coupled to the power supply 403 when the second temperature 108 needs to be altered. To change the second temperature 108 effectively, the power resistor 401 is close to the clock source 101, here shown as a quartz crystal in FIG. 4. The switch 402 controls the connection between the power resistor 401 and the power supply 403 in response to a control signal 404. In one example, the control signal 404 comprises a pulse-width-modulation (PWM) signal. By varying the duty cycle of the PWM signal 404, the equivalent voltage applied to the power resistor 401 can be changed and thus the second temperature 108 can be altered.

In one example, the switch 402 comprises a bipolar transistor with its emitter terminal and collector terminal coupled to the power resistor 401 and the power supply 403 respectively, and with it base terminal coupled to receive the control signal 404. It should be appreciated that the switch 402 may take on various configurations. Other switches, including MOS transistors, are also appropriate.

It should be appreciated that the temperature alteration module 104 may be incorporated in the circuit 10 or 20, or discrete from the circuit 10 or 20. In one example, the temperature alteration module 104 in FIG. 4 is incorporated in the circuit 10 or 20. For such purpose, the quartz crystal 101, the power resistor 401 and the switch 402 may be surface mounted on one printed circuit board and afterwards packaged. In another example, the temperature alteration module 104 comprises a thermocouple, which is discrete from the circuit 10 or 20 and disposed on a testing machine. In detail, the testing machine may have a plurality of thermocouples disposed thereon. During testing, crystals are placed with a one-to-one correspondence with the plurality of thermocouples and the first temperature of each crystal can be altered by the respective thermocouple.

Figure 5:
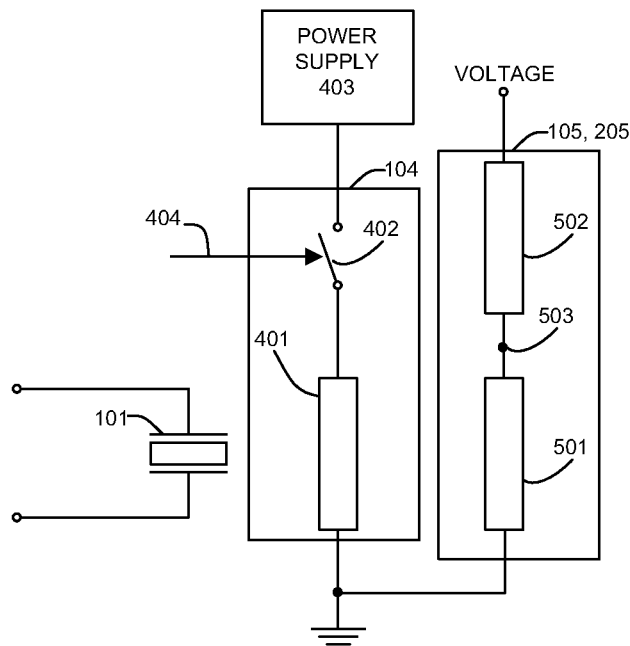
FIG. 5 illustrates an exemplary forming of the temperature sensor of the circuits of FIG. 1 and FIG. 2.

FIG. 5 illustrates an exemplary forming of the temperature sensor 105 or 205. The temperature sensor 105 or 205 comprises a thermistor 501 whose resistance varies significantly (with respect to standard resistors) with temperature. When the second temperature 108 or the first temperature 107 at the clock source 101 varies, the resistance of the thermistor 501 varies accordingly and the resistance of the resistor 502 remains approximately unchanged. Therefore, the voltage at the intermediate node 503 is changed. The voltage at the node 503 can be afterwards provided to an analog-to-digital converter (not shown) to be converted into a digital number, according to which the second temperature 108 or the first temperature 107 can be found, for example, from a lookup table generated based on the relationship between resistance and temperature of the thermistor 501.

It should be appreciated that the temperature sensor shown in FIG. 5 is just exemplary. Other devices, modules or blocks capable to sense a temperature at the clock source 101 are also appropriate.

In one example, the thermistor 501, the power resistor 401 and the clock source 101 are close to each other so that the second temperature 108 at the clock source 101 can be altered effectively and the thermistor 501 can sense the temperature of the clock source 101 exactly. In another example, the thermistor 501, the power resistor 401 and the clock source 101 are sealed in a sealing element, for example, a silicone layer, so that the thermistor 501, the power resistor 401 and the clock source 101 are isolated from the ambient. In this way, the thermistor 501, the power resistor 401 and the clock source 101 have substantially the same temperature. Other sealing materials, for example resin, are also appropriate.

The circuits according to various embodiments of the disclosure can be applied in electronic devices including, but not limited to, electric meters, point of sale devices and so on.

Figure 6:
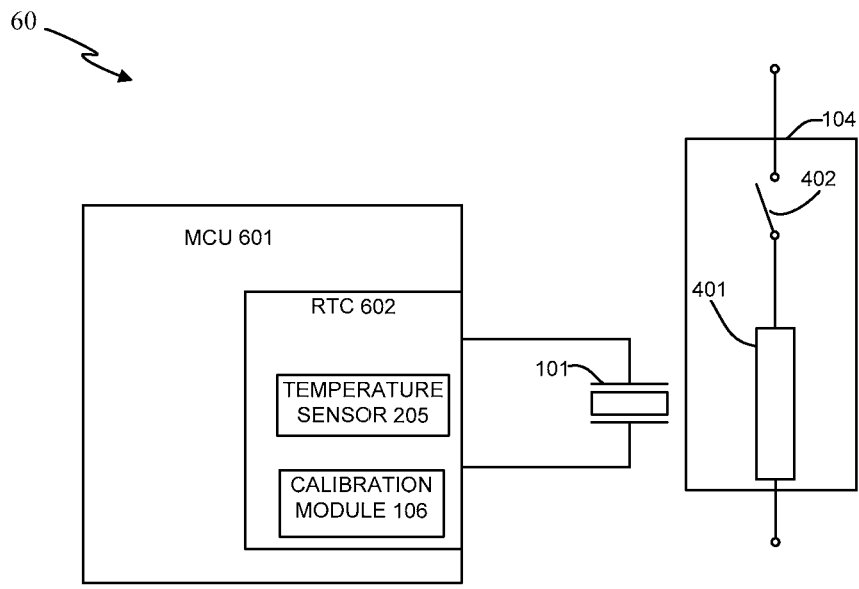
FIG. 6 illustrates an electric meter 60 according to one embodiment.

FIG. 6 illustrates an electric meter 60 according to one embodiment. The electric meter 60 comprises the circuit according to various embodiments. In this example, the electric meter 60 comprises a MCU 601 wherein a RTC module 602 is integrated. As shown, the RTC module 602 comprises the temperature sensor 205 and the calibration module 106, and the clock source 101 and the temperature alteration module 104 are external to the MCU 601. In one example, the MCU 601, the clock source 101 and the temperature alteration module 104 are surface mounted on one PC board and afterwards packaged. During a testing phase, the terminals of the temperature alteration module 104 are coupled to a power supply and ground respectively, and the control terminal of the switch 402 is coupled to, for example a PWM pin of the MCU 601, to receive a control signal. By varying the duty cycle of the control signal, the second temperature at the clock source 101 is altered. The calibration module 106 calibrates the clock signal as discussed above.

It should be appreciated that although the clock sources 101 in FIGS. 4, 5 and 6 are shown as quartz crystals, the circuit 10 or 20 also applies to other clock sources with a temperature dependent frequency performance, for example, ceramic oscillators, silicon oscillators and so on. It should also be appreciated that although the calibrating process is described as computation based on calibration parameters in some examples, the calibrating process may also be an interpolation between points in a look-up table, which can be generated by subjecting and measuring the clock source at multiple first temperatures.

In the disclosure herein, operations of circuit embodiment(s) may be described with reference to method embodiment(s) for illustrative purposes. However, it should be appreciated that the operations of the circuits and the implementations of the methods in the disclosure may be independent of one another. That is, the disclosed circuit embodiments may operate according to other methods and the disclosed method embodiments may be implemented through other circuits.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
a clock source configured to provide an oscillating signal to be divided into a clock signal;
a temperature sensor configured to sense a first temperature of the clock source;
wherein a temperature at the clock source is alterable so as to subject the clock source to at least one second temperature; and
a calibration module configured to calibrate the clock signal based on the at least one second temperature, the first temperature, a reference signal, and the oscillating signal at the at least one second temperature, wherein the calibration module is configured to compare frequencies of the reference signal and the oscillating signal in order to calibrate the clock signal.

2. The circuit of claim 1,
wherein the clock source is configured to be subjected to at least two different second temperatures; and
wherein the calibration module is configured to calibrate the clock signal based on the at least two different second temperatures, the first temperature, the reference signal and the oscillating signal at the at least two different second temperatures.

3. The circuit of claim 2, wherein the temperature sensor is further configured to sense the at least two different second temperatures.

4. The circuit of claim 3, wherein the calibration module comprises:
a calculating block configured to generate at least two calibration parameters based on the at least two different second temperatures, the reference signal and the oscillating signal at the at least two different second temperatures;
a memory configured to store and provide the at least two calibration parameters; and
a calibrating block configured to calibrate the clock signal based on the first temperature and the at least two calibration parameters.

5. The circuit of claim 1, wherein the clock source comprises a quartz crystal.

6. The circuit of claim 1, wherein the clock signal is generated by a real time clock device.

7. A circuit, comprising:
a clock source configured to provide an oscillating signal to be divided into a clock signal;
a temperature sensor configured to sense a first temperature of the clock source;
wherein a temperature at the clock source is alterable so as to subject the clock source to at least one second temperature;
a calibration module configured to calibrate the clock signal based on the at least one second temperature, the first temperature, a reference signal, and the oscillating signal at the at least one second temperature; and
a temperature alteration module configured to alter a temperature at the clock source and thus subject the clock source to at least one second temperature.

8. The circuit of claim 7, wherein the temperature alteration module comprises:
a power resistor located close to the clock source and configured to be coupled to a power supply and dissipate heat; and
a switch coupled between the power resistor and the power supply, configured to couple the power resistor to the power supply in response to a control signal.

9. The circuit of claim 8, wherein the control signal comprises a pulse-width-modulation signal with a variable duty cycle.

10. The circuit of claim 8, wherein the switch comprises a bipolar transistor.

11. The circuit of claim 8, wherein the temperature sensor, the power resistor and the clock source are located close to each other.

12. The circuit of claim 11, wherein the temperature sensor, the power resistor and the clock source are sealed in a sealing element.

13. The circuit of claim 12, wherein the sealing element comprises a silicone layer.

14. A circuit, comprising:
a clock source configured to provide an oscillating signal to be divided into a clock signal;
a temperature sensor configured to sense a first temperature of the clock source;
wherein a temperature at the clock source is alterable so as to subject the clock source to at least one second temperature;
a calibration module configured to calibrate the clock signal based on the at least one second temperature, the first temperature, a reference signal, and the oscillating signal at the at least one second temperature;
wherein the temperature sensor comprises a thermistor.

15. A circuit, comprising:
a clock source configured to provide an oscillating signal to be divided into a clock signal;
a temperature sensor configured to sense a first temperature of the clock source;
wherein a temperature at the clock source is alterable so as to subject the clock source to at least one second temperature;
a calibration module configured to calibrate the clock signal based on the at least one second temperature, the first temperature, a reference signal, and the oscillating signal at the at least one second temperature;
wherein the clock signal is generated by a real time clock device; and
wherein the real time clock device comprises an electric meter.

16. A method, comprising:
measuring a first temperature of a clock source;
subjecting the clock source to at least one second temperature;
generating at least one calibration parameter based on the at least one second temperature, a reference signal and an oscillating signal of the clock source at the at least one second temperature; and
calibrating a clock signal obtained by dividing the oscillating signal based on the at least one calibration parameter and the first temperature;
wherein generating further comprises comparing frequencies of the reference signal and oscillating signal in order to calculate said at least one calibration parameter.

17. A method, comprising:
measuring a first temperature of a clock source;
subjecting the clock source to at least one second temperature;

generating at least one calibration parameter based on the at least one second temperature, a reference signal and an oscillating signal of the clock source at the at least one second temperature; and calibrating a clock signal obtained by dividing the oscillating signal based on the at least one calibration parameter and the first temperature;

wherein subjecting comprises: coupling a power resistor to a power supply in response to a control signal.

18. The method of claim 17, wherein the control signal comprises a pulse-width-modulation signal with a variable duty cycle.

* * * * *